US008427805B2

(12) United States Patent
McCarthy et al.

(10) Patent No.: US 8,427,805 B2
(45) Date of Patent: Apr. 23, 2013

(54) ELECTROMAGNETIC SYSTEM WITH NO MUTUAL INDUCTANCE AND AN INDUCTIVE GAIN

(75) Inventors: Sean McCarthy, Dublin (IE); Seamus Flanagan, County Kildare (IE); Alan Simpson, Dublin (IE); Maxime Sorin, Dublin (IE); Michael Daly, County Wicklow (IE)

(73) Assignee: Steorn Limited, Dublin (IE)

( * ) Notice: Subject to any disclaimer, the term of this patent is extended or adjusted under 35 U.S.C. 154(b) by 227 days.

(21) Appl. No.: 13/042,513

(22) Filed: Mar. 8, 2011

(65) Prior Publication Data

US 2011/0216465 A1 Sep. 8, 2011

Related U.S. Application Data

(60) Provisional application No. 61/311,449, filed on Mar. 8, 2010.

(51) Int. Cl.
*H01H 47/00* (2006.01)
*H03J 1/18* (2006.01)
*H03J 1/22* (2006.01)
*G01R 15/18* (2006.01)

(52) U.S. Cl.
USPC ............................ 361/143; 334/4; 324/117 R

(58) Field of Classification Search .................. 361/143; 334/4; 324/117 R
See application file for complete search history.

(56) References Cited

U.S. PATENT DOCUMENTS

| | | | | |
|---|---|---|---|---|
| 2,915,637 | A | 12/1959 | McAdam | |
| 3,218,547 | A * | 11/1965 | Sung | 324/254 |
| 3,493,850 | A * | 2/1970 | Schuster | 324/342 |
| 4,904,926 | A * | 2/1990 | Pasichinskyj | 323/362 |
| 4,933,640 | A * | 6/1990 | Kuckes | 324/339 |
| 2002/0060621 | A1 | 5/2002 | Duffy et al. | |
| 2009/0174501 | A1 | 7/2009 | Parsche et al. | |

FOREIGN PATENT DOCUMENTS

| | | | |
|---|---|---|---|
| NL | 1006314 | C2 * | 12/1998 |
| WO | 2008138623 | A1 | 11/2008 |

* cited by examiner

*Primary Examiner* — Jared Fureman
*Assistant Examiner* — Scott Bauer
(74) *Attorney, Agent, or Firm* — Seyfarth Shaw LLP; Brian Michaelis

(57) ABSTRACT

An electromagnetic system consists of an electric circuit comprising two solenoids wired in series, one mounted either side and proximate to a toroid. Voltage is applied across the toroid and the solenoids in a specific sequence which alters the inductance behavior of the system, resulting in an inductance gain and no mutual inductance between the toroid and the two solenoids.

5 Claims, 4 Drawing Sheets

ELECTROMAGNETIC SYSTEM WITH NO MUTUAL INDUCTANCE AND AN INDUCTIVE GAIN

FIELD OF THE INVENTION

The present invention is in the field of electromagnetic systems and induction.

BACKGROUND OF THE INVENTION

Inductance in an electric circuit occurs where a change in the current flowing through the circuit induces an electromotive force (EMF) which opposes the change in current.

Mutual inductance is well known in the art, most commonly found in transformers. It is typically defined as a measure of the relation between the change of current flow in one circuit to the electric potential generated in another by mutual induction.

SUMMARY OF THE INVENTION

The invention disclosed herein relates to an electromagnetic system and more particularly an electromagnetic system with no mutual inductance and an inductance gain.

The electromagnetic system disclosed herein has four defined states of magnetic interaction which are switched in a defined sequence.

The system consists of a minimum of two solenoids, wired in series, one mounted either side of a toroid.

The first of the defined magnetic interactions, called step one, takes place when there is a voltage applied across the toroid.

The second of the defined magnetic interactions, called step two, takes place when there is a voltage applied across the solenoids.

The third of the defined magnetic interactions, called step three, takes place when there is no voltage applied across the toroid.

The fourth of the defined magnetic interaction sequences, called step four, takes place when there is no voltage applied across the solenoids.

For step one, a voltage is applied across the toroid.

For step two, after the completion of the current rise in the toroid, a voltage is applied across the solenoids.

For step three, after the completion of the current rise in the solenoids, the voltage across the toroid is switched off.

For step four, after the completion of the current fall in the toroids, the voltage across the solenoids is switched off.

Following this sequence of four steps, there is an inductance gain on the solenoids which is due to the saturation of the toroidal core material caused by the current flowing through the toroid. There is also an inductance gain on the toroid due to domain rotation of the toroidal core material caused by the current flowing in the solenoids. Another byproduct of this sequence is that there is no mutual inductance between the toroid and the two solenoids.

By changing the permeability of the coil's cores the inductive energy between the toroid and the solenoids is changed which leads to an inductive energy gain.

From FIG. 2 it can be seen that at step two there is an inductance gain on the solenoids. The presence of the current-carrying toroid results in a faster rise time for the solenoids than would otherwise be the case.

The curves entitled Voltage Control and Current Control show respectively the voltage across the solenoids and the current flowing through the solenoids without current flowing through the toroid.

The curves entitled Voltage Active and Current Active show respectively the voltage across the solenoids and the current flowing through the solenoids with current flowing through the toroid.

In FIG. 3, it can be seen that at step three, when the voltage is switched off in the toroid, there is an inductance gain in the toroid as a result of domain rotation in the toroid core material due to current flowing through the solenoids.

The curves entitled Voltage Control and Current Control show respectively the voltage across the toroid and the current flowing through the toroid without current flowing through the solenoids.

The curves entitled Voltage Active and Current Active show respectively the voltage across the toroid and the current flowing through the toroid with current flowing through the solenoids.

It can be seen that the fall time is longer when there is current flowing through the solenoids therefore showing the inductance gain at step 3.

The overall sequence of these steps is illustrated in FIG. 4.

BRIEF DESCRIPTION OF THE DRAWINGS

FIG. 6 is a graph showing no mutual inductance when the solenoids are switched on.

DETAILED DESCRIPTION OF THE PREFERRED EMBODIMENT

Figure 1:
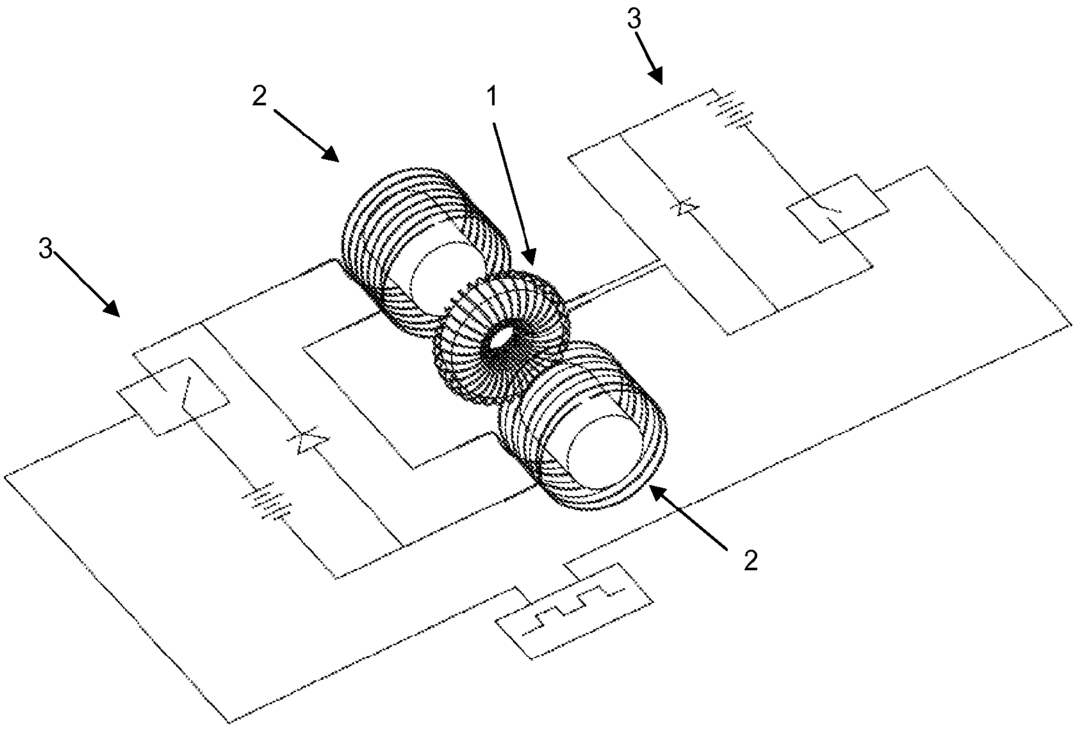
FIG. 1 is a view of the system comprising two solenoids, a toroid in the centre and associated control circuitry.
Figure 2:
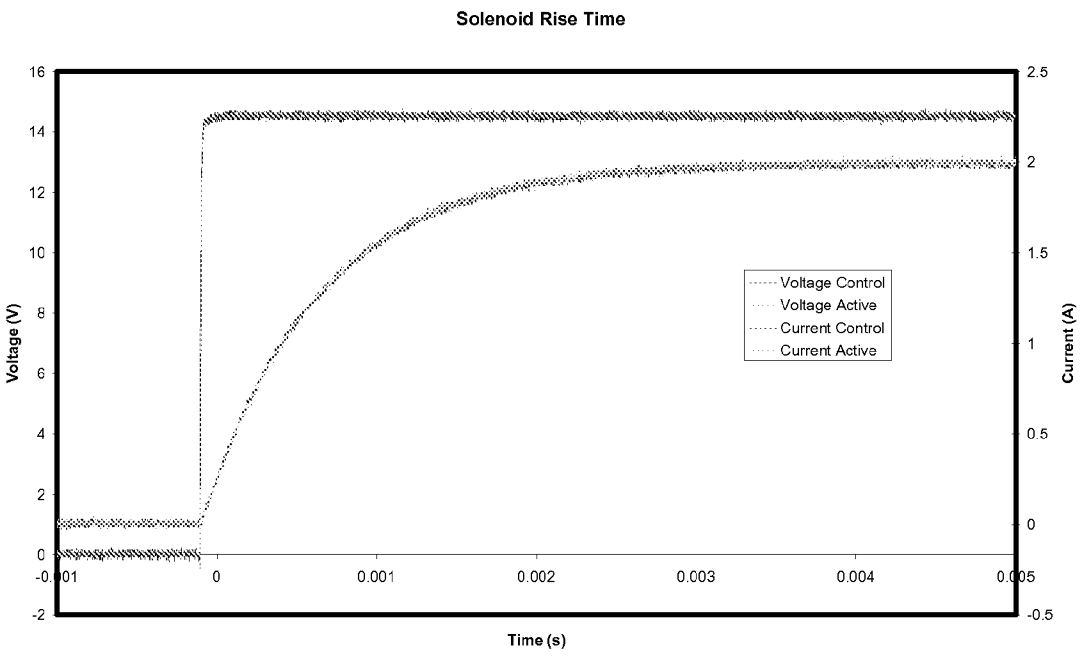
FIG. 2 is a graph showing solenoid rise time.
Figure 3:
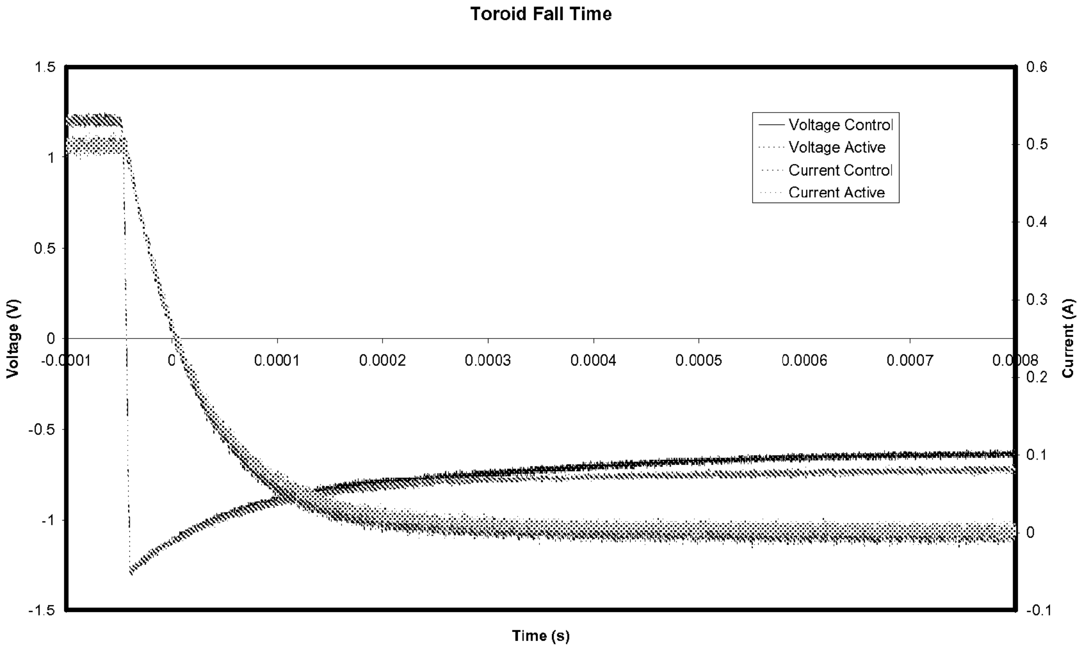
FIG. 3 is a graph showing toroid fall time.
Figure 4:
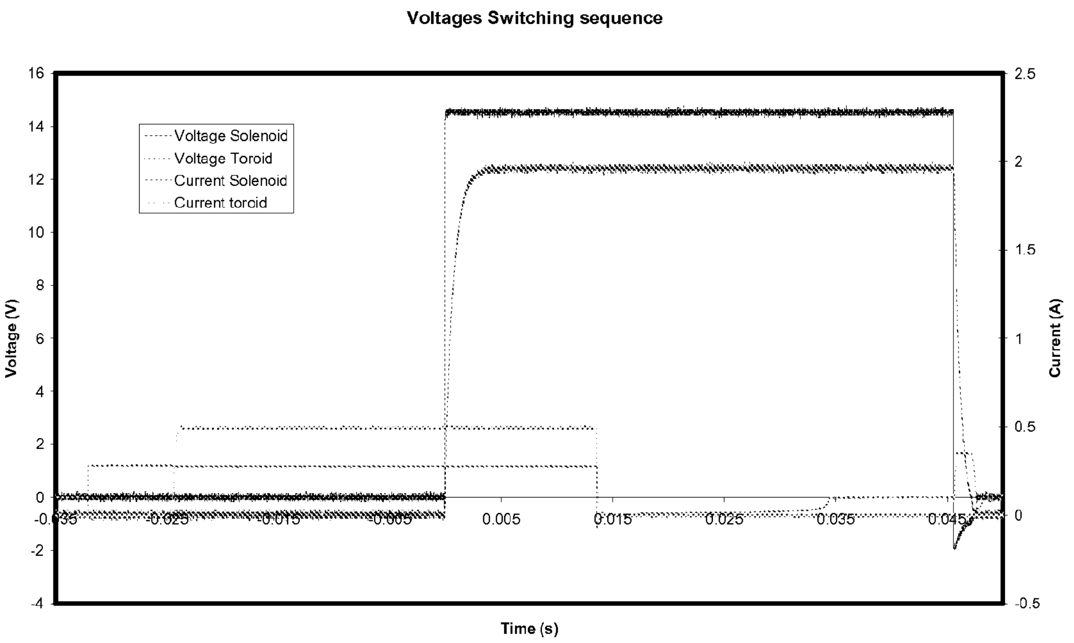
FIG. 4 is a graph showing voltage and current across the solenoids and the toroid.
Figure 5:
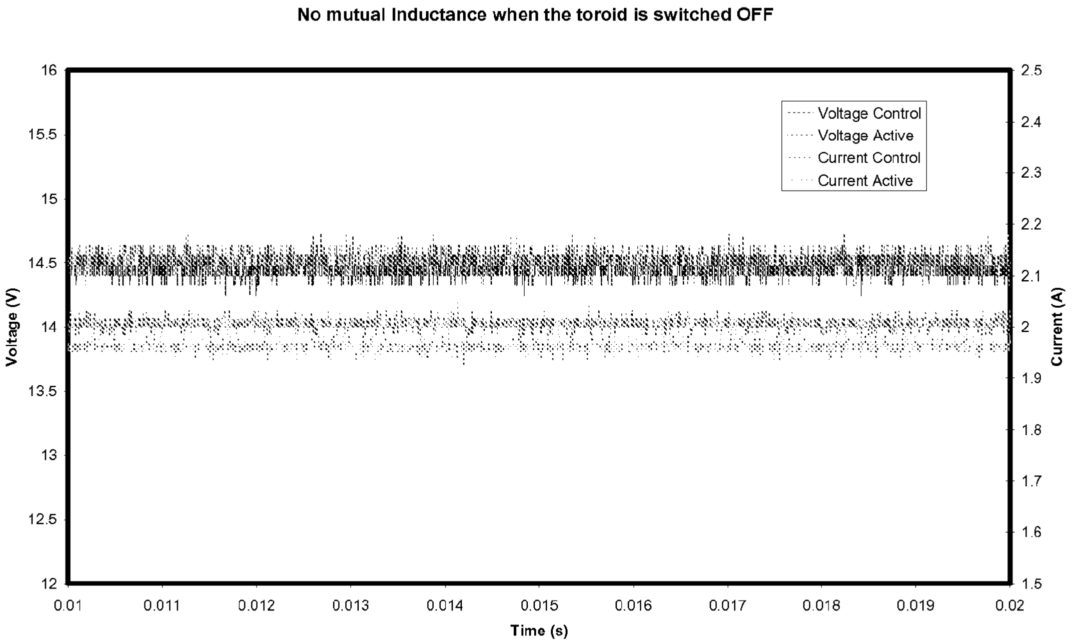
FIG. 5 is a graph showing no mutual inductance when the toroid is switched off.
Figure 6:
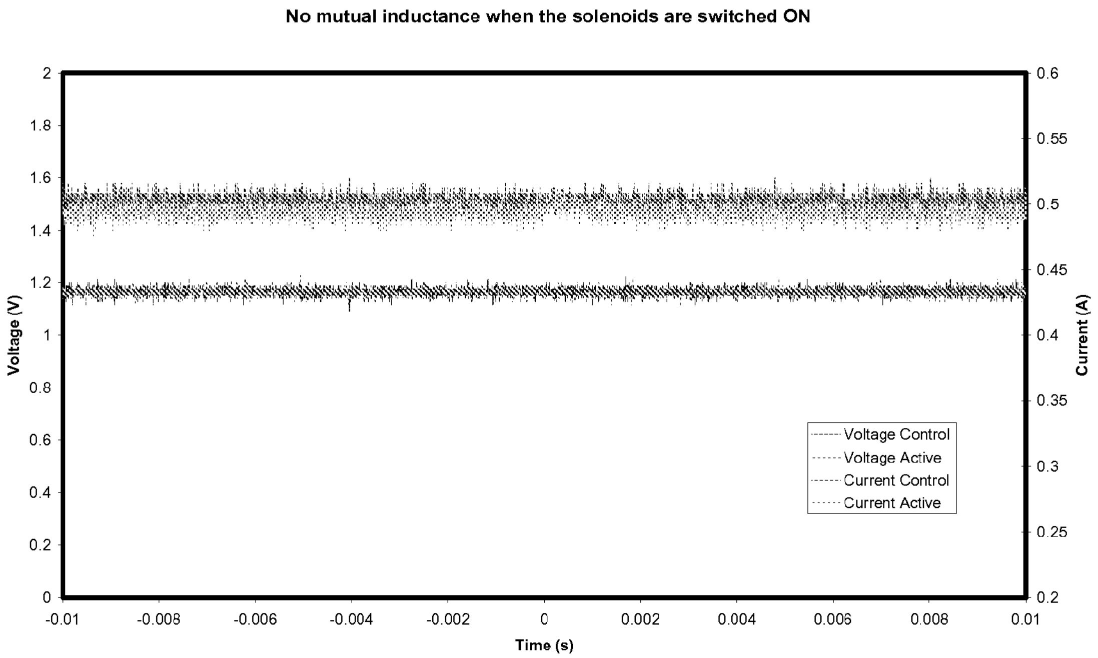

In accordance with one embodiment of the present invention illustrated in FIGS. 1-3, two solenoids 2 are mounted proximate to a toroid 1. The solenoid coils each have 380 turns of 0.425 mm diameter copper wire. The core diameter is 10 mm, length is 10 mm and the core is a 9.7*10 mm ferrite rod. The toroid coil has 380 turns of 0.375 mm copper wire. Its core is a NANOPERM ring, model no. M-059, available from Magnetec GmbH, Langenselbold, Germany.

Associated control circuitry 3 used to power the circuit and analyze the output is as follows:

- Power Supply: Laboratory DC Power Supply ISO-TECH IPS-2303
- Solid State Relay: Crydom D06D100
- Frequency generator: National Instruments Data Acquisition System with a National Instruments Labview Environment.
- Diode: Fairchild 1N914A
- Current probe: Tektronix TCP0030 Current probe
- Voltage probe: Tektronix P61139A Solid state relay inputs are connected to the frequency generator. Solid State relay outputs are connected in series to the power supply/coils circuit. Data capture is performed using a Tektronix DPO7104 oscilloscope.

While the invention has been described with reference to illustrative embodiments, it will be understood by those skilled in the art that various other changes, omissions, and/or additions may be made and substantial equivalents may be substituted for elements thereof with departing from the spirit and scope of the invention. In addition, many modifications may be made to adapt a particular situation or material to the teaching of the invention with departing from the scope thereof. Therefore, it is intended that the invention not be limited to the particular embodiment disclosed for carrying out this invention, but that the invention will include all embodiments, falling within the scope of the appended claims.

What is claimed is:

1. An electromagnetic system, comprising:

a toroid;

at least two solenoids, with at least one on each side of a central toroid, wired in series;

the electromagnetic system having four defined steps of magnetic interaction which are switched in a defined sequence, including a first step where a voltage is applied across the toroid, a second step where a voltage is applied across the solenoids, a third step where no voltage is applied across the toroid, and a fourth step where no voltage is applied across the solenoids.

2. The electromagnetic system of claim 1 wherein an inductance gain on the solenoids due to the saturation of the toroidal core material caused by the current flowing through the toroid.

3. The electromagnetic system of claim 1 wherein an inductance gain on the solenoids due to the change in permeability of the toroidal core material caused by the current flowing through the toroid.

4. The electromagnetic system of claim 1 wherein an inductance gain on the toroid due to domain rotation of the toroidal core material caused by the current flowing in the solenoids.

5. The electromagnetic system of claim 1 wherein there exists no mutual inductance between the toroid and the two solenoids due to the physical geometry i.e. symmetry of the system.

* * * * *